(12) United States Patent
Tao et al.

(10) Patent No.: US 7,524,614 B2
(45) Date of Patent: Apr. 28, 2009

(54) NEGATIVE-WORKING RADIATION-SENSITIVE COMPOSITIONS AND IMAGEABLE MATERIALS

(75) Inventors: Ting Tao, Fort Collins, CO (US); Scott A. Beckley, Windsor, CO (US)

(73) Assignee: Eastman Kodak Company, Rochester, NY (US)

( * ) Notice: Subject to any disclaimer, the term of this patent is extended or adjusted under 35 U.S.C. 154(b) by 243 days.

(21) Appl. No.: 11/441,601

(22) Filed: May 26, 2006

(65) Prior Publication Data

US 2007/0275322 A1 Nov. 29, 2007

(51) Int. Cl.
*G03F 7/029* (2006.01)

(52) U.S. Cl. ............... 430/286.1; 430/281.1; 430/302; 430/284.1; 430/285.1; 430/288.1; 430/287.1; 430/325; 430/910; 430/906; 430/914; 430/916; 430/925; 522/15; 522/31

(58) Field of Classification Search ............... None
See application file for complete search history.

(56) References Cited

U.S. PATENT DOCUMENTS

| | | | |
|---|---|---|---|
| 5,086,086 A | 2/1992 | Brown-Wensley et al. | |
| 5,668,192 A | 9/1997 | Castellanos et al. | |
| 5,965,319 A | 10/1999 | Kobayashi | |
| 6,051,366 A | 4/2000 | Baumann et al. | |
| 6,306,555 B1 | 10/2001 | Schulz et al. | |
| 6,309,792 B1 | 10/2001 | Hauck et al. | |
| 6,569,603 B2 | 5/2003 | Furukawa | |
| 6,582,882 B2 | 6/2003 | Pappas et al. | |
| 6,649,668 B1 | 11/2003 | David et al. | |
| 6,787,281 B2 | 9/2004 | Tao et al. | |
| 6,893,797 B2 | 5/2005 | Munnelly et al. | |
| 6,899,994 B2 | 5/2005 | Huang et al. | |
| 7,175,949 B1 * | 2/2007 | Tao et al. | 430/17 |
| 7,189,494 B2 * | 3/2007 | Knight et al. | 430/281.1 |
| 7,279,255 B2 * | 10/2007 | Tao et al. | 430/17 |
| 7,326,521 B1 * | 2/2008 | Tao et al. | 430/302 |
| 2002/0068241 A1 | 6/2002 | Oohashi et al. | |
| 2003/0118939 A1 | 6/2003 | Munnelly et al. | |
| 2004/0229155 A1 | 11/2004 | Rahman et al. | |
| 2005/0059752 A1 | 3/2005 | Frances | |

FOREIGN PATENT DOCUMENTS

| | | |
|---|---|---|
| EP | 1 079 276 | 2/2001 |
| EP | 1 182 033 | 2/2002 |
| EP | 1 449 650 | 8/2004 |
| JP | 6-175557 A | 6/1994 |

OTHER PUBLICATIONS

English translation of JP, 06-175557, A (1994) from machine translation from AIPN Japan Patent Office Natinal center for Industrial Property Information and Training, generated Jun. 12, 2008, 12 pages.*
JP Abstract 06-175557 (Jun. 24, 1994).
JP Abstract 2005275158 (Oct. 6, 2005).
Kesheng Feng et al "Synthesis and study of iodonium borate salts as photoinitiators", J. Polymer Science Part A: Polymer Chemistry, vol. 36, No. 10, Jul. 30, 1998 pp. 1667-1677.
U.S. Appl. No. 11/138,023, filed May 26, 2005 titled On-Press Developable Imageable Element Comprising a Tetraarylborate Salt, by E. Knight et al.
U.S. Appl. No. 11/356,518, filed Feb. 17, 2006 titled Radiation-Sensitive Compositions and Imageable Materials by T.Tao et al.
U.S. Appl. No. 11/349,376, filed Feb. 7, 2006 titled Negative-Working Radiation-Sensitive Compositions and Imageable Materials, by T.Tao et al.

* cited by examiner

*Primary Examiner*—Cynthia Hamilton
(74) *Attorney, Agent, or Firm*—J. Lanny Tucker

(57) ABSTRACT

A radiation-sensitive composition includes a radically polymerizable component and an iodonium borate initiator composition capable of generating radicals sufficient to initiate polymerization of the free radically polymerizable component upon exposure to imaging radiation. The iodonium borate composition includes a particular diaryliodonium borate compound having organic substituents to provide a sum of at least 6 carbon atoms on the iodonium cation phenyl rings. This composition can be applied to a suitable substrate to provide a negative-working imageable element with improved digital speed and good shelf life and that can be imaged to provide lithographic printing plates. The imaged elements can be developed either on-press or off-press using alkaline developers.

20 Claims, No Drawings

NEGATIVE-WORKING RADIATION-SENSITIVE COMPOSITIONS AND IMAGEABLE MATERIALS

FIELD OF THE INVENTION

This invention relates to negative-working, radiation-sensitive compositions and imageable elements such as negative-working printing lithographic printing plate precursors that have increased imaging speed and good shelf life. These imageable elements can be developed "off-press" in alkaline developers or "on-press" using printing solutions. The invention also relates to methods of using these imageable elements.

BACKGROUND OF THE INVENTION

Radiation-sensitive compositions are routinely used in the preparation of imageable materials including lithographic printing plate precursors. Such compositions generally include a radiation-sensitive component, a radically polymerizable component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Various negative-working radiation compositions and imageable elements containing reactive polymer binders are known in the art. Some of these compositions and elements are described for example in U.S. Pat. Nos. 6,569,603 (Furukawa), 6,309,792 (Hauck et al.), 6,582,882 (Pappas et al.), 6,893,797 (Munnelly et al.), 6,787,281 (Tao et al.), and 6,899,994 (Huang et al.), U.S. Patent Application Publication 2003/0118939 (West et al.), and EP 1,079,276A1 (Lifka et al.), EP 1,182,033A1 (Fujimaki et al.), and EP 1,449,650A1 (Goto).

Some negative-working compositions and imageable elements include iodonium salts, including iodonium borate salts in the initiator compositions as described for example, in copending and commonly assigned U.S. Ser. Nos. 11/138,026 (filed May 26, 2005 by Knight et al.), 11/356,518 (filed Feb. 17, 2006 by Tao et al.), and 11/349,376 (filed Feb. 7, 2006 by Tao et al.).

Problem to be Solved

The various radiation sensitive compositions of the art can readily be used to prepare negative-working imageable elements, including those containing iodonium borates as polymerization initiators. However, in some direct thermal imaging formulations, the use of diaryliodonium tetraphenylborates may cause crystallization ("blooming") on the imaging surface during keeping tests used to simulate aging. Such results are indicative of shelf-life instability. There is a need to solve this shelf-life storage problem without any loss in digital imaging speed.

SUMMARY OF THE INVENTION

The present invention provides a radiation-sensitive composition comprising:
  a free radically polymerizable component,
  an iodonium borate initiator composition capable of generating radicals sufficient to initiate polymerization of the radically polymerizable component upon exposure to imaging radiation,
  a radiation absorbing compound, and
  a polymeric binder,
  wherein the iodonium borate initiator composition comprises a diaryliodonium borate compound represented by the following Structure (I):

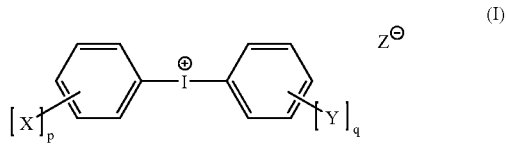

wherein X and Y are independently halo, alkyl, alkyloxy, aryl, or cycloalkyl groups, or two or more adjacent X or Y groups can be combined to form a fused ring with the respective phenyl rings, p and q are independently 0 or integers of 1 to 5, provided that either p or q is at least 1 and the sum of the carbon atoms in the X and Y substituents or fused ring is at least 6, and
  $Z^-$ is an organic anion represented by the following Structure (II):

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom.

This invention also provides an imageable element comprising a substrate having thereon an imageable layer comprising:
  a free radically polymerizable component,
  an iodonium borate initiator composition capable of generating radicals sufficient to initiate polymerization of the radically polymerizable component upon exposure to imaging radiation,
  a radiation absorbing compound, and
  a polymeric binder,
  wherein the iodonium borate initiator composition comprises a diaryliodonium borate compound as defined above in Structure (I).

Further, a method of making an imaged element comprises:

A) imagewise exposing a negative-working imageable element comprising a substrate having thereon an imageable layer comprising:
   a free radically polymerizable component,
   an iodonium borate initiator composition capable of generating radicals sufficient to initiate polymerization of the radically polymerizable component upon exposure to imaging radiation,
   a radiation absorbing compound, and
   a polymeric binder,
   wherein the iodonium borate initiator composition comprises a diaryliodonium borate compound as defined above in Structure (I), and B) without a preheat step, developing the imagewise exposed element to remove only non-exposed regions of the imageable layer.

The imaged elements provided by this method are particularly useful as lithographic printing plates. In some embodiments of the invention, the resulting imaged elements are on-press developable.

Still again, this invention provides a method of making an imageable element comprising:

A) forming an imageable layer formulation by mixing a diaryliodonium borate compound in a suitable solvent with:
   free radically polymerizable component,
   a radiation absorbing compound, and
   a polymeric binder,
   wherein the diaryliodonium borate compound is represented by the following Structure (I):

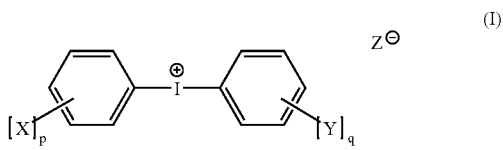

wherein X and Y are independently halo, alkyl, alkyloxy, or cycloalkyl groups or two or more adjacent X or Y groups can be combined to form a fused ring with the respective phenyl rings, p and q are independently 0 or integers of 1 to 5, provided that either p or q is at least 1 and the sum of the carbon atoms in the X and Y substituents or fused ring is at least 6, and $Z^-$ is an organic anion represented by the following Structure (II):

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom, and B) applying the imageable layer formulation to a substrate.

We have found that with the use of the noted iodonium borate initiator composition described herein, the crystallization problem is solved and thermal imaging (digital) speed is unexpectedly increased. The specific iodonium borate compounds comprise sufficient organic substituents on the phenyl rings of the iodonium cation to provide at least 6 carbon atoms. While not being limited to any specific mechanism for the present invention, it is believed that the specific type of substituents improves the compound's solubility in organic coating solvents such as methyl ethyl ketone and n-propanol.

DETAILED DESCRIPTION OF THE INVENTION

Definitions

Unless the context indicates otherwise, when used herein, the term "radiation-sensitive composition", "imageable element", and "printing plate precursor" are meant to be references to embodiments of the present invention.

In addition, unless the context indicates otherwise, the various components described herein such as "radically polymerizable component", "radiation absorbing compound", "diaryliodonium borate compound", "polymeric binder", "primary additive", and similar terms also refer to mixtures of such components. Thus, the use of the articles "a", "an", and "the" are not necessarily meant to refer to only a single component.

Moreover, unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Radiation-Sensitive Compositions

One aspect of the present invention is a radiation-sensitive composition that may have any utility wherever there is a need for a coating that is polymerizable using suitable electromagnetic radiation, and particularly where it is desired to remove unexposed regions of the coated and imaged composition. The radiation-sensitive compositions can be used to prepare imageable elements for use as printed circuit boards for integrated circuits (printing circuit boards), paint compositions, molding compositions, color filters, chemically amplified resists, imprint lithography, microelectronic and microoptical devices, and photomask lithography, and preferably printed forms such as lithographic printing plate precursors and imaged printing plates that are defined in more detail below.

The free radically polymerizable component used in the radiation-sensitive composition consists of one or more compounds that have one or more ethylenically unsaturated polymerizable or crosslinkable groups that can be polymerized or crosslinked using free radical initiation. For example, the free radically polymerizable component can be ethylenically unsaturated monomers, oligomers, and polymers including crosslinkable polymers, or a combination of such compounds. Such free radically polymerizable components are not intended to include the cationically or acid-catalytically polymerizable or crosslinkable compounds described, for example in U.S. Pat. No. 6,306,555 (Schulz et al.) such as the cyclic ethers (including non-acrylate-containing epoxides), vinyl ethers, hydroxy compounds, lactones, cyclic thioethers, and vinyl thioethers.

Thus, suitable ethylenically unsaturated compounds that can be polymerized or crosslinked include ethylenically unsaturated polymerizable monomers that have one or more of the polymerizable groups, including unsaturated esters of alcohols, such as (meth)acrylate esters of polyols. Oligomers and/or prepolymers, such as urethane (meth)acrylates, epoxide (meth)acrylates, polyester (meth)acrylates, polyether (meth)acrylates, free-radical crosslinkable polymers, and unsaturated polyester resins can also be used. In some embodiments, the radically polymerizable component comprises carboxy groups.

Particularly useful radically polymerizable components include free-radical polymerizable monomers or oligomers that comprise addition polymerizable ethylenically unsaturated groups including multiple acrylate and methacrylate groups and combinations thereof, or free-radical crosslinkable polymers. More particularly useful radically polymerizable compounds include those derived from urea urethane (meth)acrylates or urethane (meth)acrylates having multiple polymerizable groups. For example, a most preferred radically polymerizable component can be prepared by reacting DESMODUR®N100 aliphatic polyisocyanate resin based on hexamethylene diisocyanate (Bayer Corp., Milford, Conn.) with hydroxy acrylate and pentaerythritol triacrylate. Other preferred radically polymerizable compounds are available from Sartomer Company, Inc. such as SR399 (dipentaerythritol pentaacrylate), SR355 (di-trimethylolpropane tetraacrylate), SR295 (pentaerythritol tetraacrylate), and others that would be readily apparent to one skilled in the art.

Also useful are urea urethane (meth)acrylates and urethane (meth)acrylates described in U.S. Pat. Nos. 6,582,882 (noted above) and 6,899,994 (noted above), and in copending and commonly assigned U.S. Ser. No. 11/196,124 (filed Aug. 3, 2005 by Saraiya et al.) that is incorporated herein by reference.

Numerous other radically polymerizable compounds are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful radically polymerizable components are also described in EP 1,182,033A1 (noted above), beginning with paragraph [0170], all of which is incorporated herein by reference.

The radically polymerizable component is present in the radiation-sensitive composition in an amount sufficient to render the composition insoluble in an aqueous developer after exposure to radiation. This is generally from about 10 to about 70 weight % and preferably from about 20 to about 50 weight % based on the dry weight of the radiation-sensitive composition. For example, the weight ratio of radically polymerizable component to the polymeric binder (described below) is generally from about 5:95 to about 95:5, preferably from about 10:90 to about 90:10, and more preferably from about 30:70 to about 70:30.

The radiation-sensitive composition includes an iodonium borate initiator composition that is capable of generating radicals sufficient to initiate polymerization of the radically polymerizable component upon exposure of the composition to imaging radiation. The iodonium borate initiator composition may be responsive, for example, to electromagnetic radiation in the ultraviolet, visible and/or infrared spectral regions, corresponding to the broad spectral range of from about 150 to about 1500 nm. UV and visible light sensitivity is generally from about 150 to about 700 nm. Preferably, the iodonium borate initiator composition is responsive to infrared or near infrared radiation in the range of from about 600 to about 1300 nm, and more preferably to infrared radiation in the range of from about 700 to about 1200 nm.

The iodonium borate initiator compositions comprise one or more diaryliodonium borate compounds, each of which is represented by the following Structure (I):

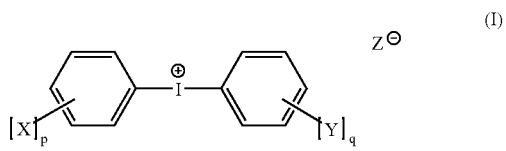

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono-and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Preferably, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated by this invention but the "symmetric" compounds are preferred (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but preferably they are at the 2- or 4-positions, and more preferably at the 4-position, on either or both phenyl rings.

Despite what type of X and Y groups are present in the iodonium cation, the sum of the carbon atoms in the X and Y substituents is at least 6, and preferably at least 8, and up to 40 carbon atoms. Thus, in some compounds, one or more X groups can comprise at least 6 carbon atoms, and Y does not exist (q is 0). Alternatively, one or more Y groups can comprise at least 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is at least 6. Still again, there may be a total of at least 6 carbon atoms on both phenyl rings.

In Structure I, p and q are independently 0 or integers of 1 to 5, provided that either p or q is at least 1. Preferably, both p and q are at least 1, and more preferably, each of p and q is 1. Thus, it is understood that the carbon atoms in the phenyl rings that are not substituted by X or Y groups have a hydrogen atom at those ring positions.

$Z^-$ is an organic anion represented by the following Structure (II):

(II)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonoyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms. None of the $R_1$ through $R_4$ groups contains halogen atoms and particularly fluorine atoms.

Preferably, $R_1$, $R_2$, $R_3$, and $R_4$ are independently substituted or unsubstituted alkyl or aryl groups as defined above, and more preferably, at least 3 of $R_1$, $R_2$, $R_3$, and $R_4$ are the same or different substituted or unsubstituted aryl groups (such as substituted or unsubstituted phenyl groups). Most preferably, all of $R_1$, $R_2$, $R_3$, and $R_4$ are the same or different substituted or unsubstituted aryl groups and most preferably, all of the groups are the same substituted or unsubstituted phenyl group. Most preferably, $Z^-$ is a tetraphenyl borate wherein the phenyl groups are substituted or unsubstituted (and preferably all are unsubstituted).

Representative iodonium borate compounds useful in this invention include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis(pentafluorophenyl)borate, 4-methylphenyl-4'-dodecylphenyliodonium tetrakis(4-fluorophenyl)borate, bis(dodecylphenyl)iodonium tetrakis(pentafluorophenyl)borate, and bis(4-t-butylphenyl)iodonium tetrakis(1-imidazolyl)borate. Preferred compounds include bis(4-t-butylphenyl)iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the iodonium borate initiator composition.

The diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry*, 37, 4241-4254 (1999), both of which are incorporated herein by reference. Synthetic Preparation Examples 2-6 provided below before the Examples also demonstrate how representative and preferred compounds can be prepared.

The iodonium borate initiator composition including one or more diaryliodonium borate compounds is generally present in the radiation-sensitive composition in an amount of at least 1% and up to 30%, based on the total solids of the radiation-sensitive composition or the dry weight of the coated imageable layer. Preferably, the composition is present in an amount of from about 2% to about 15 weight %. One or more diaryliodonium borate compounds generally comprise from about 10 to 100% of the diaryliodonium borate initiator composition. In the coated imageable layers of the imageable elements, the diaryliodonium borate compound is generally present in an amount of at least 0.01 g/m² and preferably at from about 0.03 to about 0.3 g/m².

Any of a variety of polymeric binders can be used in the radiation-sensitive composition, including those known in the art for use in negative-working radiation-sensitive compositions. The polymeric binders generally have a molecular weight of from about 2,000 to about 1,000,000 and preferably from about 10,000 to about 200,000. The acid value (mg KOH/g) of the polymeric binder is generally from about 20 to about 400 as determined using known methods.

Some binders are water-insoluble but soluble in conventional alkaline developers. Examples of such polymeric binders include but are not limited to, (meth)acrylic acid ester resins, polyvinyl acetals, phenolic resin, polymers derived from styrene, N-substituted cyclic imides or maleic anhydrides, such as those described in EP 1,182,033 (noted above) and U.S. Pat. Nos. 6,309,792 (noted above), 6,352,812 (Shimazu et al.), 6,569,603 (noted above), and 6,893,797 (noted above), all incorporated herein by reference. Also useful are the vinyl carbazole polymers having pendant N-carbazole moieties as described in copending and commonly assigned U.S. Ser. No. 11/356,518 (noted above) and the polymers having pendant vinyl groups as described in copending and commonly assigned 11/349,376, both of which are incorporated herein by reference.

Other useful polymeric binders are dispersible, developable, or soluble in water or water/solvent mixtures such as fountain solutions. Such polymeric binders include polymeric emulsions, dispersions, or graft polymers having pendant poly(alkyleneoxide) side chains that can render the imageable elements as "on-press" developable. Such polymeric binders are described for example in U.S. Pat. Nos. 6,582,882 and 6,899,994 (both noted above). In some instances, these polymeric binders are present in the imageable layer as discrete particles.

Other useful polymeric binders are described in copending and commonly assigned U.S. Ser. No. 11/196,124 (noted above) and have hydrophobic backbones and comprise both of the following a) and b) recurring units, or the b) recurring units alone:

a) recurring units having pendant cyano groups attached directly to the hydrophobic backbone, and b) recurring units having pendant groups comprising poly(alkylene oxide) segments.

These polymeric binders comprise poly(alkylene oxide) segments and preferably poly(ethylene oxide) segments. These polymers can be graft copolymers having a main chain polymer and poly(alkylene oxide) pendant side chains or segments of block copolymers having blocks of (alkylene oxide)-containing recurring units and non(alkylene oxide)-containing recurring units. Both graft and block copolymers can additionally have pendant cyano groups attached directly to the hydrophobic backbone. The alkylene oxide constitutional units are generally $C_1$ to $C_6$ alkylene oxide groups, and more typically $C_1$ to $C_3$ alkylene oxide groups. The alkylene portions can be linear or branched or substituted versions thereof. Poly(ethylene oxide) and poly(propylene oxide) segments are preferred and poly(ethylene oxide) segments are most preferred.

In some embodiments, the polymeric binders contain only recurring units comprising poly(alkylene oxide) segments, but in other embodiments, the polymeric binders comprise recurring units comprising the poly(alkylene oxide) segments as well as recurring units having pendant cyano groups attached directly to the hydrophobic backbone. By way of example only, such recurring units can comprise pendant groups comprising cyano, cyano-substituted alkylene groups, or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. Patent Application Publication 2005/003285 (Hayashi et al.) that is incorporated herein by reference.

By way of example, such polymeric binders can be formed by polymerization of a combination or mixture of suitable ethylenically unsaturated polymerizable monomers or macromers, such as:

A) acrylonitrile, methacrylonitrile, or a combination thereof,

B) poly(alkylene oxide) esters of acrylic acid or methacrylic acid, such as poly(ethylene glycol) methyl ether acrylate, poly(ethylene glycol) methyl ester methacrylate, or a combination thereof, and C) optionally, monomers such as acrylic acid, methacrylic acid, styrene, hydroxystyrene, acrylate esters, methacrylate esters, acrylamide, methacrylamide, or a combination of such monomers.

The amount of the poly(alkylene oxide) segments in such polymeric binders is from about 0.5 to about 60 weight %, preferably from about 2 to about 50 weight %, more preferably from about 5 to about 40 weight %, and most preferably from 5 to 20 weight %. The amount of (alkylene oxide) segments in the block copolymers is generally from about 5 to about 60 weight %, preferably from about 10 to about 50 weight %, and more preferably from about 10 to about 30 weight %. It is also possible that the polymeric binders having poly(alkylene oxide) side chains are present in the form of discrete particles.

The polymeric binders described above are generally present in an amount of from about 10 to about 70%, and preferably from about 20 to about 50%, based on the total solids content of the radiation-sensitive composition, or the dry weight of the imageable layer prepared therefrom.

In some embodiments, it may be useful to include "secondary" binder in combination with the polymeric binders described above. Such secondary polymeric binders include acrylic-urethane hybrid polymers that are commercially available in dispersions from Air Products and Chemicals, Inc. (Allentown, Pa.) under the tradename Hybridur, for example, the Hybridur 540, 560, 570, 580, 870, and 878 acrylic-urethane hybrid dispersions. The secondary polymeric binder may be present in the radiation-sensitive composition in an amount of from about 5 to about 40 weight % based on the total solids content of the composition, or the dry coated weight of the imageable layer.

The radiation-sensitive compositions also include a radiation absorbing compound (sometimes called a "sensitizer") that is sensitive to radiation at a desired wavelength. These compounds absorb the radiation and facilitate polymerization during imaging. The radiation absorbing compounds can be sensitive to radiation having a wavelength of from about 150 to about 1400 nm. The compounds sensitive to UV and visible radiation generally have a $\lambda_{max}$ of from about 150 to about 600 nm, and preferably from about 200 to about 550 nm.

Preferably, the radiation absorbing compounds are sensitive to infrared and near-infrared radiation, that is, from about 600 to about 1400 nm and preferably from about 700 to about 1200 nm. Such radiation absorbing compounds include carbon blacks and other IR-absorbing pigments and various IR-sensitive dyes ("IR dyes"), which are preferred.

Examples of suitable IR dyes include but are not limited to, azo dyes, squarilium dyes, crotonate dyes, triarylamine dyes, thiazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes.

Suitable dyes are also described in U.S. Pat. Nos. 5,208,135 (Patel et al.), 6,569,603 (noted above), and 6,787,281 (noted above), and EP Publication 1,182,033 (noted above), that are incorporated herein by reference.

A general description of one class of suitable cyanine dyes is shown by the formula in paragraph [0026] of WO 2004/101280, incorporated herein by reference, and two specific examples of useful IR absorbing compounds are identified below with the Examples as IR Dyes 1 and 2.

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (Hauck et al.), 6,264,920 (Achilefu et al.), 6,153,356 (Urano et al.), and 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Useful IR absorbing compounds include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

The radiation absorbing compound can be present in the radiation-sensitive composition in an amount generally of at least 0.1% and up to 20% and preferably from about 0.5 to about 10%, based on total solids in the composition, that also corresponds to the total dry weight of the imageable layer. Alternatively, the amount can be defined by an absorbance in the range of from about 0.05 to about 3, and preferably from about 0.1 to about 1.5, in the dry film as measured by reflectance UV-visible spectrophotometry. The particular amount needed for this purpose would be readily apparent to one skilled in the art, depending upon the specific compound used.

The radiation-sensitive composition can also include a "primary additive" that is a poly(alkylene glycol) or an ether or ester thereof that has a molecular weight of from about 200 and up to 4000 (preferably from about 500 to about 2000). This primary additive is present in an amount of from about 2 to about 50 weight % (preferably from about 5 to about 30%) based on the total solids content of the composition, or the total dry weight of the imageable layer.

Particularly useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth) acrylate, and polyethylene glycol mono methacrylate. Also useful are SR9036 (ethoxylated (30) bisphenol A dimethacrylate), CD9038 (ethoxylated (30) bisphenol A diacrylate), and SR494 (ethoxylated (5) pentaerythritol tetraacrylate), and similar compounds all of which that can be obtained from Sartomer Company, Inc. In some embodiments, the primary additive may be "non-reactive" meaning that it does not contain polymerizable vinyl groups.

The radiation-sensitive composition can also include a "secondary additive" that is a poly(vinyl alcohol), a poly (vinyl pyrrolidone), poly(vinyl imidazole), or polyester in an amount of up to and including 20 weight % based on the total solids content of the composition, or the total dry weight of the imageable layer.

The radiation-sensitive composition can also include a variety of optional compounds including but not limited to, dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

In some embodiments, the radiation-sensitive composition also includes a mercaptan derivative such as a mercaptotriazole such as 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2, 4-triazole. Various mercaptobenzimidazoles, mercaptobenzthiazoles, and mercaptobenzoxazoles may also be present.

Imageable Elements

The imageable elements are formed by suitable application of a radiation-sensitive composition as described above to a suitable substrate to form an imageable layer. This substrate can be treated or coated in various ways as described below prior to application of the radiation-sensitive composition. Preferably, there is only a single imageable layer comprising the radiation-sensitive composition of this invention. If the substrate has been treated to provide an "interlayer" for improved adhesion or hydrophilicity, the applied radiation-sensitive composition is generally considered the "top" or outermost layer. These interlayers, however, are not considered "imageable layers". While there is usually no need to apply what is conventionally known as an overcoat (such as an oxygen impermeable topcoat) to the imageable layer(s) as described in WO 99/06890 (Pappas et al.), it can be used if desired. Such overcoat layers can comprise one or more water-soluble polymers such as poly(vinyl alcohol), poly(vinyl pyrrolidone), and poly(vinyl imidazole) and generally are present at a dry coating weight of from about 0.1 to about 4 g/m$^2$.

The substrate generally has a hydrophilic surface, or at least a surface that is more hydrophilic than the applied radiation-sensitive composition on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing. Preferably, the aluminum sheet is electrochemically anodized using phosphoric acid or sulfuric acid and conventional procedures.

An interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid copolymer, poly(acrylic acid), or acrylic acid copolymer. Preferably, the aluminum support is mechanically-grained, phosphoric acid-anodized, and treated with poly(acrylic acid) using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 µm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaging cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Preferably, the radiation-sensitive composition is applied as the outermost layer.

Illustrative of such manufacturing methods is mixing the radically polymerizable component, iodonium borate initiator composition, radiation absorbing compound, polymeric binder, primary additive, and any other components of the radiation-sensitive composition in a suitable organic solvent [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Preferred coating solvents and representative imageable layer formulations are described in the Examples below. After proper drying, the coating weight of the imageable layer is generally from about 0.1 to about 5 g/m$^2$, preferably from about 0.5 to about 3.5 g/m$^2$, and more preferably from about 0.5 to about 1.5 g/m$^2$.

Layers can also be present under the imageable layer to enhance developability or to act as a thermal insulating layer. The underlying layer should be soluble or at least dispersible in the developer and preferably have a relatively low thermal conductivity coefficient.

The imageable elements have any useful form including but not limited to, printing plate precursors, printing cylinders, printing sleeves and printing tapes (including flexible printing webs). Preferably, the imageable members are printing plate precursors that can be of any useful size and shape (for example, square or rectangular) having the requisite imageable layer disposed on a suitable substrate. Printing cylinders and sleeves are known as rotary printing members having the substrate and imageable layer in a cylindrical form. Hollow or solid metal cores can be used as substrates for printing sleeves.

Imaging Conditions

During use, the imageable element is exposed to a suitable source of radiation such as UV, visible light, near-infrared, or infrared radiation, depending upon the radiation absorbing compound present in the radiation-sensitive composition, at a wavelength of from about 150 to about 1400 nm. Preferably, imaging is carried out using an infrared laser at a wavelength of from about 700 to about 1200 nm. The laser used to expose the imageable element is preferably a diode laser, because of the reliability and low maintenance of diode laser systems, but other lasers such as gas or solid state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1060 to about 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Creo Trendsetter® imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging can be carried out generally at an imaging energy of at least 20 mJ/cm$^2$ and up to and including 500 mJ/cm$^2$, preferably at from about 50 to about 300 mJ/cm$^2$.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

Without the need for a pre-heat step after imaging, the imaged elements can be developed "off-press" using conventional processing and a conventional aqueous alkaline or organic alkaline developer. Alternatively, the imaged elements can be developed "on-press" as described in more detail below.

For off-press development, the developer composition commonly includes surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of the alkaline developer is preferably from about 8 to about 14. The imaged elements are generally developed using conventional processing conditions. Both aqueous alkaline developers and solvent-based alkaline developers can be used with the latter type of alkaline developers being preferred.

Solvent-based alkaline developers are generally single-phase solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight. These developers are preferred.

Aqueous alkaline developers generally have a pH of at least 7 and preferably of at least 11. Useful alkaline aqueous developers include 3000 Developer, 9000 Developer, GOLDSTAR Developer, GREENSTAR Developer, ThermalPro Developer, PROTHERM Developer, MX1813 Developer, and MX1710 Developer (all available from Kodak Polychrome Graphics, a subsidiary of Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Representative solvent-based alkaline developers include ND-1 Developer, 955 Developer, Developer 980, and 956 Developer (available from Kodak Polychrome Graphics a subsidiary of Eastman Kodak Company).

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals.

Following this off-press development, the imaged element can be rinsed with water and dried in a suitable fashion. The dried element can also be treated with a conventional gumming solution (preferably gum arabic). In addition, a post-bake operation can be carried out, with or without a blanket exposure to UV or visible radiation. Alternatively, a post-UV floodwise exposure (without heat) can be used to enhance the performance of the imaged element.

Printing can be carried out by applying a lithographic ink and fountain solution to the printing surface of the imaged and developed element. The fountain solution is taken up by the non-imaged regions, that is, the surface of the hydrophilic substrate revealed by the imaging and development steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

Some imageable elements of this invention are designed for development "on-press". This type of development avoids the use of the developing solutions described above. The imaged element is directed mounted on press wherein the unexposed regions in the imageable layer are removed by a suitable fountain solution, lithographic ink, or both, during the initial impressions in printing. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.). On-press development is demonstrated in Example 3 below.

The following examples are provided to illustrate the practice of the invention but are by no means intended to limit the invention in any manner.

EXAMPLES

The components and materials used in the examples and analytical methods used in evaluation were as follows:

Blue 63 was a leuco dye color former that was obtained from Yamamoto Chemicals, Inc. (Japan) and has the following structure:

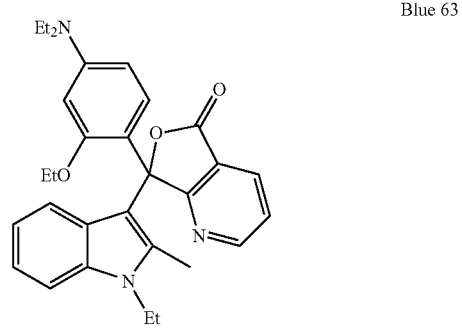

Blue 63

Byk® 307 was a polyethoxylated dimethyl polysiloxane copolymer that is available from Byk Chemie (Wallingford, Conn.) in a 25 wt. % xylene/methoxypropyl acetate solution.

Byk® 336 was a 25% (weight) solution of a modified dimethyl polysiloxane copolymer in xylene/methoxypropyl acetate that was obtained from Byk Chemie.

DHBP was 2,4-dihydroxybenzophenone and was obtained from Aldrich Chemical Company (Milwaukee, Wis.).

Elvacite 4026 was a 10% (weight) solution of a highly branched poly(methyl methacrylate) in methanol that was obtained from Lucite International, Inc. (Cordova, Tenn.).

IBPF was bis(4-t-butylphenyl)iodonium hexafluorophosphate that was obtained from Sanwa Chemical Co., Ltd. (Japan).

Irgacure 250 was iodonium, (4-methylphenyl)[4-(2-methylpropyl)phenyl]-, hexafluorophosphoate and was obtained from Ciba Specialty Chemicals Corp. (Switzerland)

Irganox® 1035 was thiodiethylene bis(3,5-di-tert-butyl-4-hydroxyhydrocinnamate) and was obtained from Ciba Specialty Chemicals Company.

IR Dye 1 was obtained from Showa Denko (Japan) and is represented by the following formula:

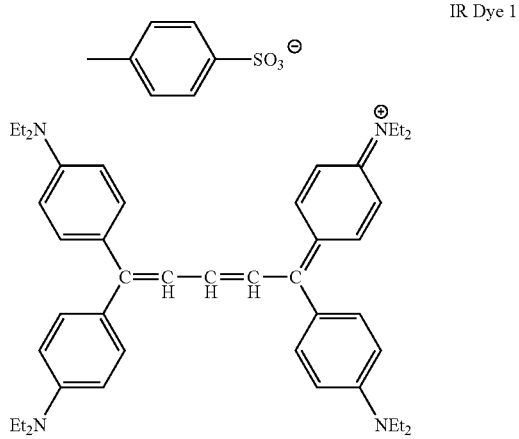

IR Dye 1

IR Dye 2 was obtained from Eastman Kodak Company and is represented by the following formula:

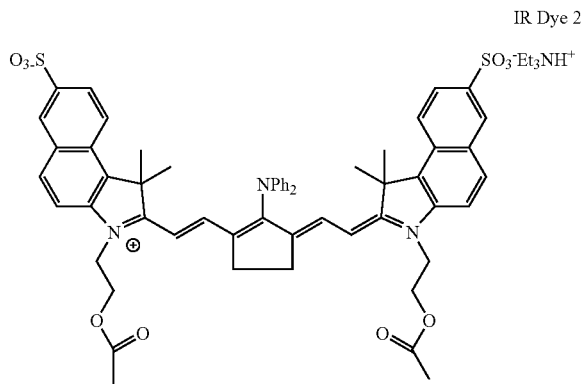

IR Dye 2

Klucel M was a 1% (weight) solution of hydroxypropyl cellulose in water that was obtained from Hercules Inc., Aqualon Division (Wilmington, Del.).

MEK was methyl ethyl ketone.

Oligomer A was a urethane acrylate that was prepared by reacting Desmodur N 100 with hydroxyethyl acrylate and pentaerythritol triacrylate (80% by weight in MEK).

PEGMA was poly(ethylene glycol) methyl ether methacrylate (50% water) that was obtained from Aldrich Chemical Company.

PEGDA was a polyethylene glycol diacrylate (MW=700) that was obtained from Aldrich Chemical Co. (Milwaukee, Wis.).

PGME was 1-methoxy-2-propanol that is also known as Dowanol PM.

Pigment 951 was a 27% solids dispersion of 7.7 parts of a polyvinyl acetal derived from poly(vinyl alcohol) acetalized with acetaldehyde, butyraldehyde, and 4-formylbenzoic acid, 76.9 parts of Irgalith Blue GLVO (Cu-phthalocyanine C.I. Pigment Blue 15:4), and 15.4 parts of Disperbyk® 167 dispersant (Byk Chemie) in 1-methoxy-2-propanol.

SR399 was dipentaerythritol pentaacrylate that was obtained from Sartomer Company, Inc. (Exton, Pa.).

956 Developer was a solvent based (phenoxyethanol) alkaline negative developer (Kodak Polychrome Graphics, a subsidiary of Eastman Kodak Company, Norwalk, Conn., USA).

Synthetic Preparation 1: Initiator A (4-methylphenyl-4'-isobutylphenyl iodonium tetraphenylborate)

$NaBPh_4$ (34.2 g, Aldrich Chemical Co.) was dissolved in n-propanol (500 g) and water (500 μg) in a 2000 ml flask and was marked as container A. Irgacure 250 (66 g, 75% solution in propylene carbonate, Ciba) was dissolved in n-propanol (200 g) and water (200 g) in a 1000 ml flask and was marked as container B. The solution in the container B was slowly added drop wise into the solution in the container A with stirring. A white precipitate was formed. After filtration the solid washed by 500 ml of propanol followed by 500 ml of water. The solid was collected and dried at ambient temperature overnight, and in a 40° C. oven for 3 hours. The yield was 65 g. $^1$H NMR spectrum (in DMSO-$d_6$) exhibited chemical shifts at the following values δ [ppm]: 0.79 (d, 6H), 1.79 (m, 1H), 2.30 (s, 3H), 2.47 (d, 2H), 6.77 (t, 4H), 6.93 (t, 8H), 7.18 (br, 8H), 7.29 (m, 4H) and 8.08 (m, 4H).

Synthetic Preparation 2: Initiator B (4-octyloxyphenyl phenyliodonium tetraphenylborate)

$NaBPh_4$ (3.42 g) was dissolved in n-propanol (12.5 g) and water (25 g) in a 200 ml flask and was marked as container A. 4-Phenyl-4-octyloxyphenyl iodonium hexafluorophosphate (5.52 g, prepared by a procedure described in *Journal of polymer Science, Part A: Polymer Chemistry*, volume 37, pp. 4241-4254) was dissolved in n-propanol (25 g) and water (50 g) in a 100 ml flask and was marked as container B. The solution in the container B was slowly added drop wise into the solution in the container A with stirring. A sticky precipitate was formed. After decanting the solvent, the solid (about 7 g) was dissolved in 10 g of tetrahydrofuran. The % solid was 15.9% for further use. $^1$H NMR spectrum (in DMSO-$d_6$) exhibited chemical shifts at the following values δ [ppm]: 0.82 (t, 3H), 1.25 (m, 10H), 1.66 (m, 2H), 3.97 (t, 2H), 6.75 (t, 4H), 6.90 (t, 8H), 7.02 (d, 2H), 7.17 (br, 8H), 7.49 (t, 2H), 7.60 (t, 1H) and 8.12 (m, 4H).

Synthetic Preparation 3: Initiator C ([4-[(2-hydroxytetradecyl)oxy]phenyl]phenyliodonium tetraphenylborate)

$NaBPh_4$ (1.4 g) was dissolved in acetone (10 g) and water (10 g) in a 50 ml flask and was marked as container A. [4-[(2-Hydroxytetradecyl)oxy]phenyl]phenyliodonium hexafluoroantimonate (1.49 g, Aldrich Chemical Co.) was dissolved in acetone (6 g) and water (6 g) in a 50 ml flask and was marked as container B. The solution in the container B was mixed with the solution in the container A with stirring by a glass rod. A sticky precipitate was formed and the mixture was allowed to stand in fume hood for 3 hours. The liquid was decanted and the sticky product washed with water (10 g each) three times. The sticky material (about 1.5 g) was dissolved in about 10 g of MEK. The % solid was measured as 13.7% for further use. $^1$H NMR spectrum (in DMSO-$d_6$) exhibited chemical shifts at the following values δ [ppm]: 0.89 (m, 3H), 1.20-1.50 (m, 20H), 2.55 (m, 2H), 3.78 (m, 1H), 3.90 (m, 2H), 4.92 (d, 1H), 6.81 (t, 4H), 6.96 (t, 8H), 7.10 (d, 2H), 7.22 (br, 8H), 7.52 (t, 2H), 7.67 (t, 1H) and 8.20 (m, 4H).

Synthetic Preparation 4: Initiator D (bis-t-butylphenyliodonium tetraphenylborate)

$NaBPh_4$ (45 g) was dissolved in n-propanol (100 g) and water (160 g) in a 500 ml beaker marked as container A. Bis(4-t-butylphenyl)iodonium-hexafluorophosphate (67.3 g, Sanwa Chemical Co., Ltd.) was dissolved in n-propanol (500 g) and water (800 g) in a 2000 ml beaker marked as container B. The solution in the container A was slowly (in about 15 minutes) added to the solution in the container B while severely stirring by a Silverson L4R. A white precipitate was formed and the mixture was stored in a refrigerator for 6 hours. After a first filtration, the white solid was collected and washed with 400 ml of water. The product obtained from a second filtration was dried under ambient temperature overnight and then at 40° C. in an oven for 4 hours to obtain 84.2 g of white solid. $^1$H NMR spectrum (in DMSO-$d_6$) exhibited chemical shifts at the following values δ [ppm]: 1.31 (s, 18H), 6.72 (t, 4H), 6.98 (t, 8H), 7.22 (br, 8H), 7.59 (d, 4H) and 8.18 (d, 4H).

Synthetic Preparation 5: Initiator E (4-methylphenyl-4'-hexylphenyliodonium tetraphenylborate)

4-Iodotoluene (21.8 g, Aldrich Chemical Co.) and a 75% sulfuric acid solution (163 g) were placed in a 500 ml flask equipped with a flux condenser, a thermometer, a stirrer, an ice-water bath and a nitrogen inlet. Hexylbenzene (17.8 g, Aldrich Chemical Co.) was added and the heterogeneous mixture is cooled to below 10° C. Ammonium persulfate (47.9 g) was added in portions in 30 minutes so that the temperature did not exceed 15° C. The reaction mixture was stirred at room temperature for 5 hours and then slowly added to a well-stirred suspension containing NaPF$_6$ (19.1 g), water (300 g), and ethyl acetate (250 g). After the addition completed, the stirring was continued for 10 minutes and the mixture was transferred to a separate funnel. After separation, the water layer was discarded, and organic layer washed with a 5% solution of NaHCO$_3$ until CO$_2$ no longer evolved. The ethyl acetate was removed through a rotary evaporator and 49 g of a highly viscous liquid was obtained (mainly containing 4-methylphenyl-4'-hexylphenyliodonium hexafluorophosphate). Five grams of the resulting liquid was dissolved in n-propanol (50 g) and water (50 g) in a 200 ml flask marked as container A. NaBPh$_4$ (3.4 g, Aldrich Chemical Co.) was dissolved in n-propanol (25 g) and water (25 g) in a 500 ml flask marked as container B. The solution in the container A was slowly added drop wise into the solution in the container B with stirring. A sticky precipitate was formed. After decanting the solvent, the resulting solid (about 7 g) was dissolved in methyl ethyl ketone (10 g). The % solid was 25.1% for further use. $^1$H NMR spectrum (in DMSO-$d_6$) exhibited chemical shifts at the following values δ [ppm]: 0.81 (t, 3H), 1.21 (m, 6H), 1.50 (m, 2H), 2.30 (s, 3H) 2.55 (t, 2H), 6.76 (t, 4H), 6.90 (t, 8H), 7.18 (br, 8H), 7.29 (m, 4H) and 8.06 (m, 4H).

Synthetic Preparation 6: Initiator F (4-methylphenyl-4'-cyclohexylphenyliodonium tetraphenylborate)

4-Iodotoluene (21.8 g) and a 75% sulfuric acid solution (163 g) were placed in a 500 ml flask equipped with a flux condenser, a thermometer, a stirrer, an ice-water bath and a nitrogen inlet. Phenyl cyclohexane (17.6 g, 0.11 mol, Aldrich Chemical Co.) was added and the heterogeneous mixture was cooled to below 10° C. Ammonium persulfate (47.9 g) was added in portions over 30 minutes so that the temperature did not exceed 15° C. The reaction mixture was stirred at room temperature for 5 hours and then slowly added to a well-stirred suspension containing NaPF$_6$ (19.1 g), water (300 g), and ethyl acetate (250 g). After the addition completed, the stirring was continued for 10 minutes and the mixture was transferred to a separate funnel. After separation, the water layer was discarded and organic layer washed with a 5% solution of NaHCO$_3$ until CO$_2$ no longer evolved. The ethyl acetate was removed through a rotary evaporator and 49 g of a high viscous liquid was obtained (mainly contained 4-methylphenyl-4'-hexylphenyliodonium hexafluorophosphate). Five grams of the resulting liquid was dissolved in n-propanol (50 g) and water (50 g) in a 200 ml flask marked as container A. NaBPh$_4$ (3.4 g, Aldrich Chemical Co.) was dissolved in n-propanol (25 g) and water (25 g) in a 500 ml flask marked as container B. The solution in the container A was slowly added dropwise to the solution in the container B with stirring. A light brown precipitate was formed. After a first filtration, the solid was collected and washed with 100 ml of water. The product obtained from a second filtration was dried under ambient temperature overnight and then at 30° C. in an oven for 4 hours to obtain 6.9 g of a light brown solid. $^1$H NMR spectrum (in DMSO-$d_6$) exhibited chemical shifts at the following values δ [ppm]: 1.10-1.90 (m, 10H), 2.38 (s, 3H) 2.58 (m, 1H), 6.83 (t, 4H), 6.98 (t, 8H), 7.25 (br, 8H), 7.37 (m, 4H) and 8.12 (m, 4H).

Synthetic Preparation 7: Initiator G (2-methyl-4-t-butylphenyl-4'-methylphenyliodonium tetraphenylborate)

4-Iodotoluene (MW=218, 21.8 g, 0.1 mol) in a 75% sulfuric acid solution (163 g) were placed in a 500 ml flask equipped with a flux condenser, a thermometer, a stirrer, and a nitrogen inlet. 4-t-Butyltoluene (MW=148, 1.63 g, 0.11 mol) was added and the heterogeneous mixture is cooled to 10° C. Ammonium persulfate (MW=228, 47.9 g, 0.21 mol) was added in portions over 30 minutes so that the temperature does not exceed 15° C. The reaction mixture was stirred at room temperature for 5 hours. The reaction mixture was stirred at room temperature for 5 hours and then slowly added to a well-stirred suspension containing NaPF$_6$ (19.1 g), water (300 g), and ethyl acetate (250 g). After addition completed, the stirring was continued for 10 minutes and the mixture was transferred to a separate funnel. After separation, the water layer was discarded, and organic layer washed with 5% NaHCO$_3$ until CO$_2$ no longer evolved. The ethyl acetate was removed through a rotary evaporator and 29 g of high viscous liquid was obtained (some insoluble solid at the bottom). The resulting liquid was dissolved in n-propanol (100 g) and water (100 g) in a 300 ml flask marked as container A. NaBPh$_4$ (10.0 g, from Aldrich) was dissolved in n-propanol (100 g) and water (100 g) in a 500 ml flask marked as container B. The solution in the container A was slowly added drop wise to the solution in the container B with stirring. A white precipitate was formed. After filtration, the solid washed with water (300 g) followed by filtration again. A white solid (19 g) was obtained after drying at 40° C. oven for 5 hours. $^1$H NMR spectrum (in DMSO-$d_6$) exhibited chemical shifts at the following values δ [ppm]: 1.28 (s, 9H), 2.32 (s, 3H), 2.54 (s, 3H), 6.79 (t, 4H), 6.93 (t, 8H), 7.18 (br, 8H), 7.32 (d, 2H), 7.44 (d, 1H), 7.57 (d, 1H), 8.12 (d, 2H) and 8.41 (s, 1H).

Synthetic Preparation 8: Polymer A

AIBN [2,2'-azobis(iso-butyronitrile), Vazo-64, 1.6 g], methyl methacrylate (20 g), acrylonitrile (24 g), N-vinyl carbazole (20 g), methacrylic acid (16 g), and N,N'-dimethylacetamide (DMAC, 320 g) were placed in a 1000-ml 3-necked flask, equipped with magnetic stirring, temperature controller, and N$_2$ inlet. The reaction mixture was heated to 60° C. and stirred under N$_2$ protection overnight (about 16 hours). The % N.V. was measured with about 20%.

To above reaction mixture (after nitrogen protection was removed), potassium hydroxide (5.2 g) in water (40 g) was slowly added and a viscous liquid was formed. After stirring the mixture for 10 minutes, vinyl benzyl chloride (14 g) was added and the mixture was stirred at 55° C. for 3 hours. Concentrated (36%) hydrochloric acid (12 g) in DMAC (40 g) was added to the flask and the reaction mixture was stirred for another 5 hours. The resulting reaction mixture was then slowly dropped into a mixture of 12 liters of ice water with 20 g of concentrated hydrochloric acid while stirring. The resulting precipitate was filtered and washed with 2000 ml of propanol, followed by washing with 2000 ml of water. A fine white powder was obtained after filtration. The powder was dried at room temperature overnight and then at 50° C. for 3 hours to obtain 84 g of polymer solid.

Synthetic Preparation 9: Polymer B

A solution of PEGMA (20 g) dissolved in a mixture of deionized water (74.8 g) and n-propanol (241.4 g), was charged into a 1000 ml four-necked flask, and was heated slowly to slight reflux (76° C.) under $N_2$ atmosphere. A pre-mixture of styrene (20 g), acrylonitrile (70 g) and Vazo-64 (0.7 g) was added over a 2-hour period. Six hours later, another aliquot of Vazo-64 (0.5 g) was added. The temperature was raised to 80° C. Subsequently, two more aliquots of Vazo-64 (0.35 g each) were added over a period of 6 hours. After reaction for a total of 19 hours, the conversion to copolymer was >98% based on a determination of percent non-volatiles. The weight ratio of PEGMA/styrene/-acrylonitrile was 10:20:70 and n-propanol/water ratio was 76:24. The residual acrylonitrile in solution was 0.5% based on determination by $^1$H-NMR.

Example 1

Preparation of Imageable Element Using Various Initiator Compositions

Six imageable layer formulations were individually prepared by dissolving Polymer A (1 g), Oligomer A (0.73 g), IR Dye 1 (0.08 g), Irganox® 1035 (1.11 g, 5% in MEK), SR-399 (0.55 g), pigment 951 (0.3 g), PEGDA (0.28 g), Byk® 307 (0.28 g), and each of Initiators A to F (0.22 g, one in each solution) in PGME (30.3 g) and MEK (15.2 g). A mechanically-grained and phosphoric acid anodized aluminum substrate that had been post-treated with poly(acrylic acid) was coated with each of the formulations at a dry coating weight of about 1.3 g/m$^2$ when properly dried at 77° C. for about 2 minutes on a rotating drum.

The resulting imageable element was placed on a CREO Trendsetter 3244x image setter (Creo, a subsidiary of Eastman Kodak Company, Burnaby, British Columbia, Canada) and exposed to an 830 nm IR laser at an exposure energy of from 50 to 210 mJ/cm$^2$. The imaged elements were then developed using a Sword Excel NE34 plate processor charged with 956 Developer at 25° C. The minimum energy to achieve a solid image was about 90 mJ/cm$^2$. After the resulting printing plates were incubated individually at 50° C. and at 38° C. plus 80% humidity for 5 days, the element containing Initiator A showed crystals (blooming) on the imaging surface while the elements containing Initiators B to F did not.

Example 2

Imageable Elements for On-Press Development

Six imageable layer formulations were individually prepared by dissolving Polymer B (2.76 g), Oligomer A (0.69 g), IR Dye 2 (0.09 g), mercaptotriazole (0.06 g), SR399 (0.34 g), Klucel M (2.2 g, 1% in water), Elvacite 4026 (1.1 g, 10% in MEK), PEGDA (0.21 g), 25% Byk® 336 (0.2 g), and each of Initiators A to F (0.18 g, one in each solution) in n-propanol (22.1 g), water (7 g), and MEK (13.1 g). A mechanically-grained and phosphoric acid anodized aluminum substrate that had been post-treated with poly(acrylic acid) was coated with each of the formulations solution at a dry coating weight of about 1.0 g/m$^2$ when properly dried at 77° C. for about 2 minutes on a rotating drum.

The resulting imageable elements was placed on a CREO Trendsetter 3244x image setter (Creo, Burnaby, British Columbia, Canada) and exposed to an 830 nm IR laser at an exposure range from 50 to 100 mJ/cm$^2$. The imaged elements was then mounted directly on an AB Dick press using Van Son Rubber Base Black ink and fountain solution containing Varn 142W etch at 3 oz per gallon (22.5 g/liter) and PAR alcohol replacement at 3 oz per gallon (22.5 g/liter).

The developed printing plates were used to print 250 copies of good quality prints when the press was stopped. After the printing plates prepared from the same composition and conditions were incubated individually at 50° C. and at 38° C. plus 80% humidity for 5 days, the printing plate containing Initiator A showed crystals (blooming) on the imaging surface while the other printing plates containing Initiators B to F did not.

Example 3

Preparation of on-Press Developable Imageable Element

An imageable layer formulation was prepared by dissolving Polymer B (5.42 g), Oligomer A (1.27 g), IR Dye 2 (0.18 g), 3-mercaptotriazole (0.11 g), SR-399 (0.69 g), Klucel M (4.41 g, 1% in water), Elvacite 4026 (1.98 g, 10% in MEK), PEGDA (0.27 g), Blue 63 (2 g, 10% in THF), DHBP (0.1 g), Byk® 336 (0.4 g), and Initiator D (0.31 g) in n-propanol (44.2 g), water (13 g), and MEK (24.7 g). A mechanically-grained and phosphoric acid anodized aluminum substrate that had been post-treated with poly(acrylic acid) was coated with above formulation to provide a dry coating weight of about 1.0 g/m$^2$ when properly dried at 77° C. for about 2 minutes on a rotating drum.

The resulting imageable element (printing plate precursor) was incubated either at ambient temperature or at 50° C. for 5 days. The elements (both ambient and 50° C. aged) were tested on a CREO Trendsetter 3244x image setter (Creo, Burnaby, British Columbia, Canada) and exposed to an 830 nm IR laser at 120 mJ/cm$^2$. The imaged elements were then mounted directly on a Komori press charged with a black ink containing 1.5% of calcium carbonate and a fountain solution containing Varn Litho Etch 142W at 3 oz./gal (22.5 g/liter) and PAR alcohol replacement at 3 oz/gal (22.5 g/liter) (both available from Varn International of Addison, Ill.). Both resulting printing plates were well developed by the fountain solution from the first sheet, and were used to print more than 30,000 copies of good quality prints.

Comparative Example 1

On-Press Developable Element with Different Initiator Compositions & Printing Test An imageable layer formulation was prepared by dissolving Polymer B (2.43 g), Oligomer A (0.56 g), IR Dye 2 (0.08 g), 3-mercaptotriazole (0.05 g), SR-399 (0.56 g), Klucel M (1.93 g, 1% in water), Elvacite 4026 (0.96 g, 10% in MEK), NaBPh$_4$ (0.08 g), Byk® 336 (0.18 g), and bis-t-butylphenyliodonium hexafluorophosphate (IBPF) in n-propanol (27.2 g), water (7.3 g), and MEK (8.2 g). A mechanically-grained and phosphoric acid anodized aluminum substrate that had been post-treated with poly(acrylic acid) was coated with above formulation to provide a dry coating weight of about 1.0 g/m$^2$ when properly dried at 77° C. for about 2 minutes on a rotating drum. The resulting imageable element (plate) was incubated either at ambient temperature or at 50° C. for 5 days. The plates (both ambient and 50° C. aged) were tested on a CREO Trendsetter 3244x image setter (Creo, Burnaby, British Columbia, Canada) and exposed to an 830 nm IR laser at 120 mJ/cm².

The imaged elements were then mounted directly on a Komori press charged with a black ink containing 1.5% of calcium carbonate and a fountain solution containing Varn Litho Etch 142W at 3 oz/gal (22.5 g/liter) and PAR alcohol replacement at 3 oz./gal (22.5 g/liter), both available from Varn International of Addison, Ill.). The resulting printing plate that had been incubated under ambient conditions was well developed by foundation solution from the first sheet and was used to print more than 30,000 copies of good quality prints, while the printing plate that had been incubated at 50° C. was not developed by fountain solution and printed with background sensitivity for the entire run.

Example 4

Alkaline-Developable Imageable Element & Printing Test

An imageable layer formulation coating solution was prepared by dissolving polymer A (2.1 g), Oligomer A (1.45 g), SR-399 (1.13 g), Initiator D (0.39 g), IR Dye 1 (0.17 g), Irganox 1035 (0.83 g, 5% in MEK), Pigment 951 (0.6 g), PEGDA (0.55 g), and Byk® 307 (0.55 g) in PGME (60.5 g) and MEK (31.8 g). A mechanically-grained and phosphoric acid anodized aluminum substrate that had been post-treated with poly(acrylic acid) was coated with above formulation to provide a dry coating weight of about 1.3 g/m² when properly dried at 77° C. for about 2 minutes on a rotating drum.

The resulting imageable element was incubated either at ambient temperature or at 50° C. for 5 days. The imaged elements (both ambient and 50° C. aged) were exposed to an 830 nm IR laser at 120 mJ/cm² on a CREO Trendsetter 3244x image setter (Creo, Burnaby, British Columbia, Canada), and were developed in an SE 34 processor (Kodak Polychrome Graphics, a subsidiary of Eastman Kodak Company) charged with 956 Developer at 25° C. The resulting printing plates showed clean background and good resolution, and were then mounted on a Miehle sheet-fed press using a wear ink containing 1.5% calcium carbonate to produce at least 20,000 good impressions.

Comparative Example 2

Alkaline-Developable Imageable Elements & Printing Test

An imageable layer formulation was prepared by dissolving polymer A (2.05 g), Oligomer A (1.45 g), SR-399 (1.11 g), Initiator A (0.39 g), IR Dye 1 (0.17 g), Irganox 1035 (0.83 g, 5% in MEK), Pigment 951 (0.6 g), PEGDA (0.55 g), and Byk® 307 (0.55 g) in PGME (60.5 g) and MEK (31.8 g). A mechanically-grained and phosphoric acid anodized aluminum substrate that had been post-treated with poly(acrylic acid) was coated with above formulation and to provide a dry coating weight of about 1.3 g/m² when properly dried at 77° C. for about 2 minutes on a rotating drum. The resulting imageable element was incubated either at ambient temperature or at 50° C. for 5 days. After incubation, the elements irregularly produced a numbers of crystals on the imaging surface especially in the element that had been incubated at 50° C.

Comparative Example 3

Alkaline-Developable Imageable Elements Containing a Cationically Curable Epoxy Component An imageable layer formulation was prepared by dissolving polymer A (0.51 g), 3,4-epoxycyclohexylmethyl-3,4-epoxycyclohexanecarboxylate (an epoxy compound from Aldrich, 0.51 g), Initiator A (0.10 g), IR Dye 1 (0.04 g), Irganox 1035 (0.55 g, 5% in MEK), Pigment 951 (0.15 g), PEGDA (0.14 g), and Byk® 307 (0.14 g) in PGME (15.1 g) and MEK (7.7 g). A mechanically-grained and phosphoric acid anodized aluminum substrate that had been post-treated with poly (acrylic acid) was coated with above formulation by using a wire-wound rod. The coating was subsequently dried for approximately 90 seconds residence time in a Ranar conveyor oven set at about 100° C. to provide a dry coating weight of about 1.3 g/m². The resulting imageable element was placed on a CREO Trendsetter 3244x image setter (Creo, a subsidiary of Eastman Kodak Company, Burnaby, British Columbia, Canada) and exposed to an 830 nm IR laser at an exposure energy of from 50 to 210 mJ/cm². The imaged elements were then developed using a Sword Excel NE34 plate processor charged with 956 Developer at 25° C. No image was obtained from the element due to poor development on unexposed area.

Comparative Example 4

Alkaline-Developable Imageable Elements Containing an Acid-Catalytically Curable Melamine Component An imageable layer formulation was prepared by dissolving polymer A (0.51 g), Cymel-303 ULF Resin (a hexamethoxymethylmelamine resin from CYTEC Industries Inc., 0.51 g), Initiator A (0.10 g), IR Dye 1 (0.04 g), Irganox 1035 (0.55 g, 5% in MEK), Pigment 951 (0.15 g), PEGDA (0.14 g), and Byk® 307 (0.14 g) in PGME (15.1 g) and MEK (7.7 g). A mechanically-grained and phosphoric acid anodized aluminum substrate that had been post-treated with poly(acrylic acid) was coated with above formulation by using a wire-wound rod. The coating was subsequently dried for approximately 90 seconds residence time in a Ranar conveyor oven set at about 100° C. to provide a dry coating weight of about 1.3 g/m². The resulting imageable element was placed on a CREO Trendsetter 3244x image setter (Creo, a subsidiary of Eastman Kodak Company, Burnaby, British Columbia, Canada) and exposed to an 830 nm IR laser at an exposure energy of from 50 to 210 mJ/cm². The imaged elements were then developed using a Sword Excel NE34 plate processor charged with 956 Developer at 25° C. No decent image was obtained up to 210 mJ/cm² exposure due to low OD on imaged areas.

The invention has been described in detail with particular reference to certain preferred embodiments thereof, but it will be understood that variations and modifications can be effected within the spirit and scope of the invention.

The invention claimed is:

1. A radiation-sensitive composition comprising:
   a free radically polymerizable component,
   an iodonium borate initiator composition capable of generating radicals sufficient to initiate polymerization of said radically polymerizable component upon exposure to imaging radiation,
   a radiation absorbing compound, and a polymeric binder, wherein said iodonium borate initiator composition comprises a diaryliodonium borate compound represented by the following Structure (I):

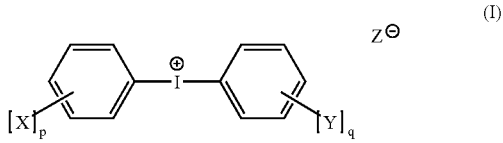

wherein X and Y are independently halo, alkyl, alkyloxy, or cycloalkyl groups or two or more adjacent X or Y groups can be combined to form a fused ring with the respective phenyl rings, p and q are independently 0 or integers of 1 to 5, provided that either p or q is at least 1 and the sum of the carbon atoms in the X and Y substituents or fused ring is at least 6, and Z is an organic anion represented by the following Structure (II):

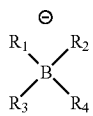

wherein $R_1$, $R_2$, $R_3$, and $R_4$ are the same or different substituted or unsubstituted aryl groups.

2. The composition of claim 1 wherein X and Y are independently alkyl, alkyloxy, or cycloalkyl. groups, both p and q is at least 1, and $R_1$, $H_2$, $H_3$, and $R_4$ are the same substituted or unsubstituted aryl groups.

3. The composition of claim 1 wherein X and Y are independently alkyl groups and at least 3 of $R_1$, $R_2$, $R_3$, and $R_4$ are the same unsubstituted aryl groups.

4. The composition of claim 1 wherein Z is a tetraphenytorate.

5. The composition of claim 1 wherein said iodonium borate initiator composition includes one or more of 4-octyloxyphenyl phenyliodonium tetraphenylborate, [4-[(2-hydroxytetradecyl) -oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t -butylphenyl)iodonium tetrakis(pentafluorophenyl)borate, 4-hexyiphenyl -phenyliodonium tetraphenylborate, 4-cyclohexyiphenyl -phenyliodonium tetraphenylborate, 2-methyl-4-t-butylphenyl-4'-methylphenyliodonium tetraphenylborate, 4-methylphenyl-4'-pentylphenyliodonium tetrakis[3,S-bis(trifluoromethyl)phenyl] borate, 4-methoxyphenyl-4 '-cyclohexyiphenyliodonium tetrakis(pentafluorophenyl)borate, and 4-methylphenyl-4'-dodecylphenyliodonium tetrakis(4-fluorophenyl)borate.

6. The composition of claim 1 wherein said diaryliodonium borate initiator composition is present in an amount of at least 1 weight %.

7. The composition of claim 1 wherein said free radically polymerizable component consists of an ethylenically unsaturated free-radical polymerizable monomer or oligomer, or a free-radical crosslinkable polymer.

8. The composition of claim 1 wherein said polymeric binder is a polymer comprising pendant vinyl groups or a pendant N-carbazole moiety, and said radiation absorbing compound is infrared radiation sensitive.

9. An imageable element comprising a substrate having thereon an imageable layer comprising:
a free radically polymerizable component,
an iodonium borate initiator composition capable of generating radicals sufficient to initiate polymerization of said radically polymerizable component upon exposure to imaging radiation,
a radiation absorbing compound, and
a polymeric binder,
wherein said iodonium borate initiator composition comprises a diaryliodonium borate compound represented by the following Structure (I):

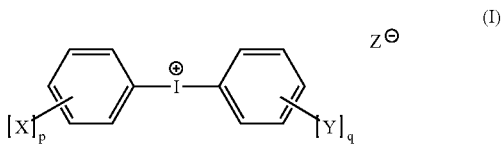

wherein X and Y are independently halo, alkyl, alkyloxy, or cycloalkyl groups or two or more adjacent X or Y groups can be combined to form a fused ring with the respective phenyl rings, p and q are independently 0 or integers of 1 to 5, provided that either p or q is at least 1 and the sum of the carbon atoms in the X and Y substituents or fused ring is at least 6, and $Z^-$ is an organic anion represented by the following Structure (II):

wherein $R_1$, $R_2$, $R_3$, and $R_4$ are the same or different substituted or unsubstituted aryl groups.

10. The imageable element of claim 9 wherein said imageable layer is the outermost coated layer, said radiation absorbing compound is an H-sensitive dye, said jodonium borate initiator composition comprises bis(4-t-butylphenyl)iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexyiphenyliodonium tetraphenytorate, or a mixture thereof in an amount of from about 0.01 to about 0.3 g/m², said free radically polymerizable component consists of an unsaturated free-radical polymerizable monomer or oligomers, or a free-radical crosslinkable polymer, and said polymeric binder is a polymer comprising pendant vinyl groups or a pendant N-carbazole moiety.

11. The element of claim 9 wherein X and Y are independently alkyl, alkyloxy, or cycloalkyl groups, both p and q is at least 1, and $R_1$, $R_2$, $R_3$, and $R_4$ are the same substituted or unsubstituted aryl groups.

12. The element of claim 9 wherein X and Y are independently alkyl groups and Z is a tetraarylborate.

13. The element of claim 9 that is an infrared radiation - sensitive element and said radiation absorbing compound is an JR dye.

14. The element of claim 9 that is on-press developable.

15. A method of making an imaged element comprising:
A) imagewise exposing the negative-working imageable element of claim 9, and
B) without a preheat step, developing said imagewise exposed element to remove only non-exposed regions of said imageable layer.

16. The method of claim 15 wherein said radiation absorbing compound is carbon black or an JR-sensitive dye and said imagewise exposing step A is carried out using radiation having a maximum wavelength of from about 700 to about 1200 nm at an energy level of from about 20 to about 500 mJ/cm$^2$.

17. The method of claim 15 wherein said imagewise exposed element is developed on-press.

18. An imaged element obtained from the method of claim 15.

19. A method of making an imageable element comprising:
A) forming an imageable layer formulation by mixing a diaryliodonium borate compound in a suitable solvent with:
a free radically polymerizable component,
a radiation absorbing compound, and
a polymeric binder,
wherein said diaryliodonium borate compound is represented by the following Structure (I):

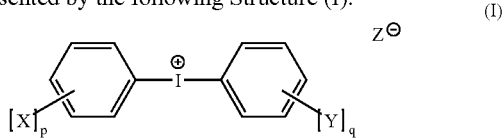

(I)

wherein X and Y are independently halo, alkyl, alkyloxy, or cycloalkyl groups or two or more adjacent X or Y groups can be combined to form a fused ring with the respective phenyl rings, p and q are independently 0 or integers of 1 to 5, provided that either p or q is at least 1 and the sum of the carbon atoms in the X and Y substituents or fused ring is at least 6, and Z is an organic anion represented by the following Structure (II):

(II)

wherein $R_1$, $R_2$, $R_3$ and $R_4$ are the same or different substituted or unsubstituted aryl groups, and B) applying said imageable layer formulation to a substrate.

20. An imageable element obtained by the method of claim 19.

* * * * *

UNITED STATES PATENT AND TRADEMARK OFFICE
CERTIFICATE OF CORRECTION

PATENT NO. : 7,524,614 B2  
APPLICATION NO. : 11/441601  
DATED : April 28, 2009  
INVENTOR(S) : Ting Tao and Scott A. Beckley Page 1 of 1

It is certified that error appears in the above-identified patent and that said Letters Patent is hereby corrected as shown below:

| On the Title Pg, Issued Patent | Line | Description of Error |
|---|---|---|
| Item (56) (Other Publications) | 2 | Delete "Natinal" and insert -- National --, therefor. |
| Item (56) (Other Publications) | 10 | Delete "11/138,023," and insert -- 11/138,026, --, therefor. |
| Col. 25 | 21 | In Claim 1, delete "Z" and insert -- $Z^-$ --, therefor. |
| 25 | 35 (Approx.) | In Claim 2, delete "cycloalkyl." and insert -- cycloalkyl --, therefor. |
| 25 | 36 (Approx.) | In Claim 2, delete "$H_2$, $H_3$," and insert -- $R_2$, $R_3$, -- therefor. |
| 25 | 41-42 (Approx.) | In Claim 4, delete "tetraphenytorate." and insert -- tetraphenylborate. --, therefor. |
| 26 | 46 (Approx.) | In Claim 10, delete "H-sensitive" and insert -- IR-sensitive --, therefor. |
| 26 | 46 (Approx.) | In Claim 10, delete "jodonium" and insert -- iodonium --, therefor. |
| 26 | 66 | In Claim 13, delete "JR" and insert -- IR --, therefor. |
| 27 | 9 | In Claim 16, delete "JR-sensitive" and insert -- IR-sensitive --, therefor. |
| 28 | 9 | In Claim 19, delete "Z" and insert -- $Z^-$ --, therefor. |

Signed and Sealed this  
First Day of March, 2011

David J. Kappos  
*Director of the United States Patent and Trademark Office*